(12) United States Patent
Shenoy et al.

(10) Patent No.: US 6,169,458 B1
(45) Date of Patent: Jan. 2, 2001

(54) DIFFERENTIAL CHARGE PUMP WITH REDUCED CHARGE-COUPLING EFFECTS

(75) Inventors: Ravindra U. Shenoy, Sunnyvale; Xiaomin Si, San Jose, both of CA (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/388,036

(22) Filed: Sep. 1, 1999

(51) Int. Cl.[7] .............................. H03L 7/089; H03B 1/00
(52) U.S. Cl. ................... 331/17; 331/8; 331/25; 327/111; 327/112; 327/157
(58) Field of Search .................... 331/8, 17, 25, 331/34; 327/108–112, 148, 156–159, 536

(56) References Cited

U.S. PATENT DOCUMENTS

| | | | |
|---|---|---|---|
| 4,636,748 | * 1/1987 | Latham, II | 331/17 |
| 4,695,747 | * 9/1987 | Latham, II | 307/317 R |
| 6,011,822 | * 1/2000 | Dreyer | 375/376 |

* cited by examiner

Primary Examiner—David Mis

(57) ABSTRACT

A system and method for a differential charge pump with reduced charge-coupling effects for use in integrated circuits such as a phase-lock loop are disclosed. The charge pump includes a first branch, a second branch, and a charge device. The first branch includes a first current source and sink coupled to a power supply and ground, respectively, a first current steering device coupled between the first current source and sink, and a first buffer coupled to the first current steering device between a first charge node and a first damp node. The second branch includes a second current source and sink coupled to a power supply and ground, respectively, a second current steering device coupled between the second current source and sink, and a second buffer coupled to the second current steering device between a second charge node and a second damp node. The charge device is coupled between the first buffer and the second buffer at the first and second charge nodes, the first and second buffers being adapted to vary voltages at the first and second damp nodes relative to voltages at the first and second charge nodes, respectively. Each of the current steering devices is adapted to selectively steer current from one of the first and second current sources through the charge device to one of the first and second current sinks.

20 Claims, 6 Drawing Sheets

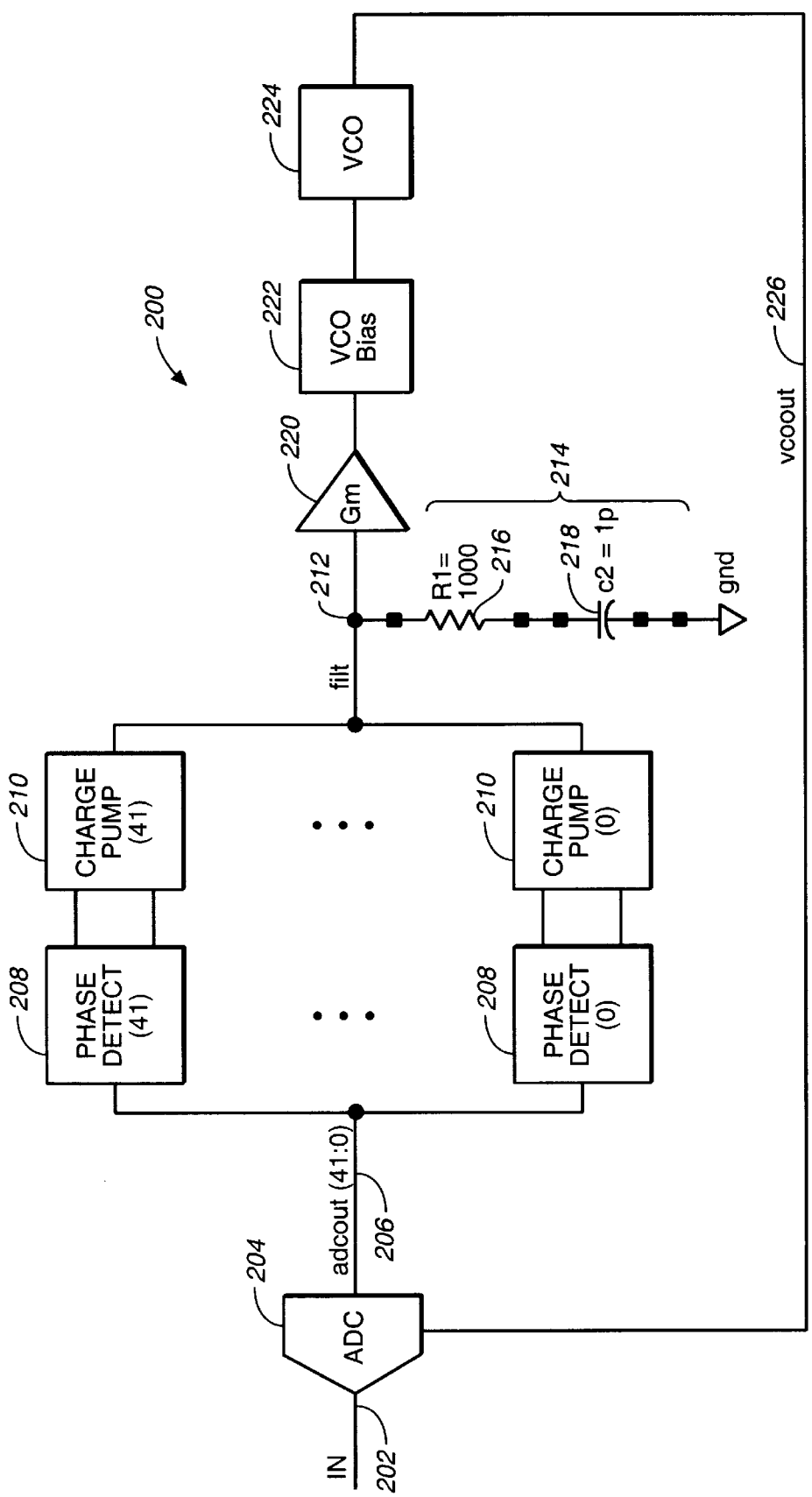
FIG._1

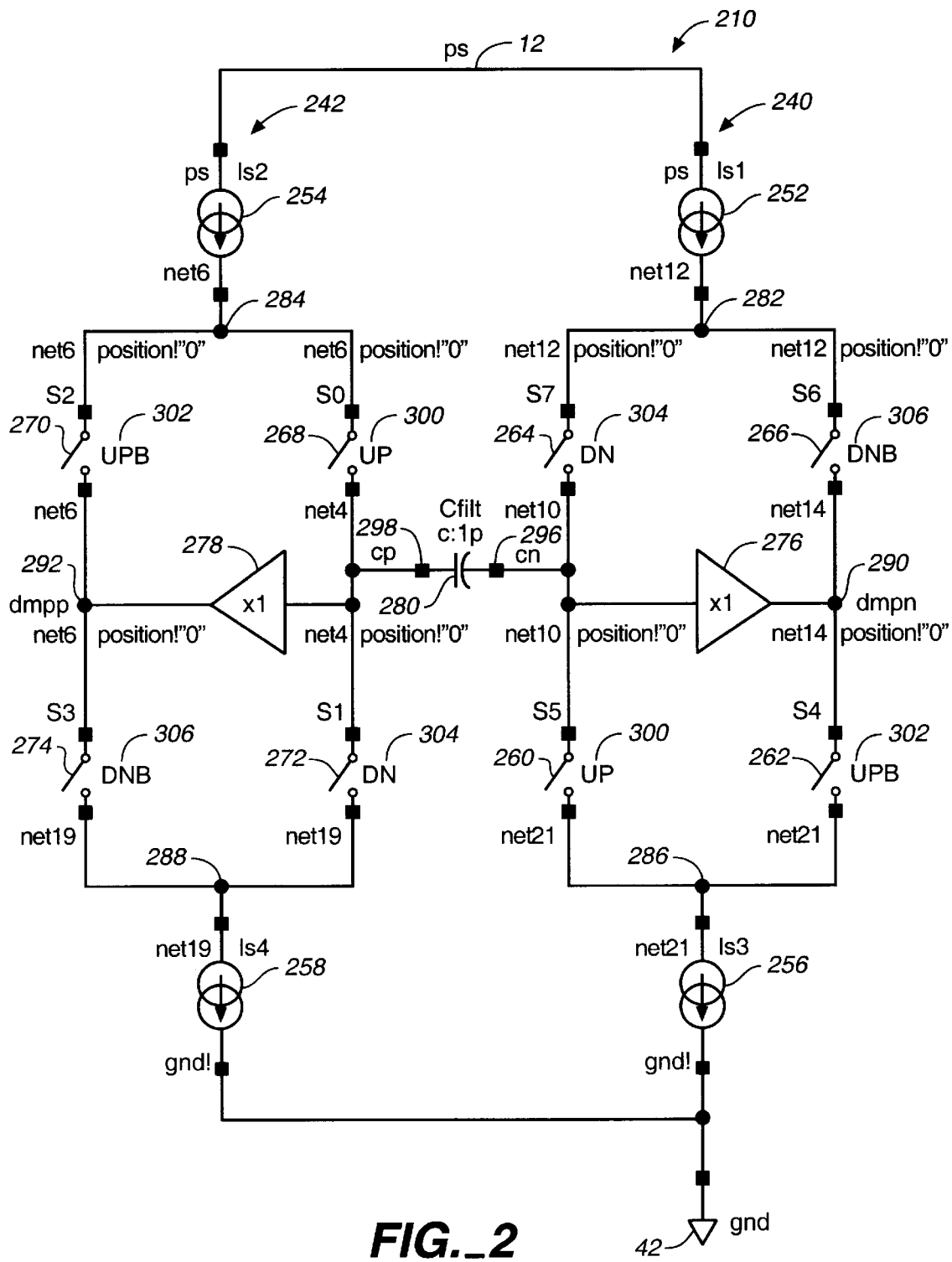
FIG._2

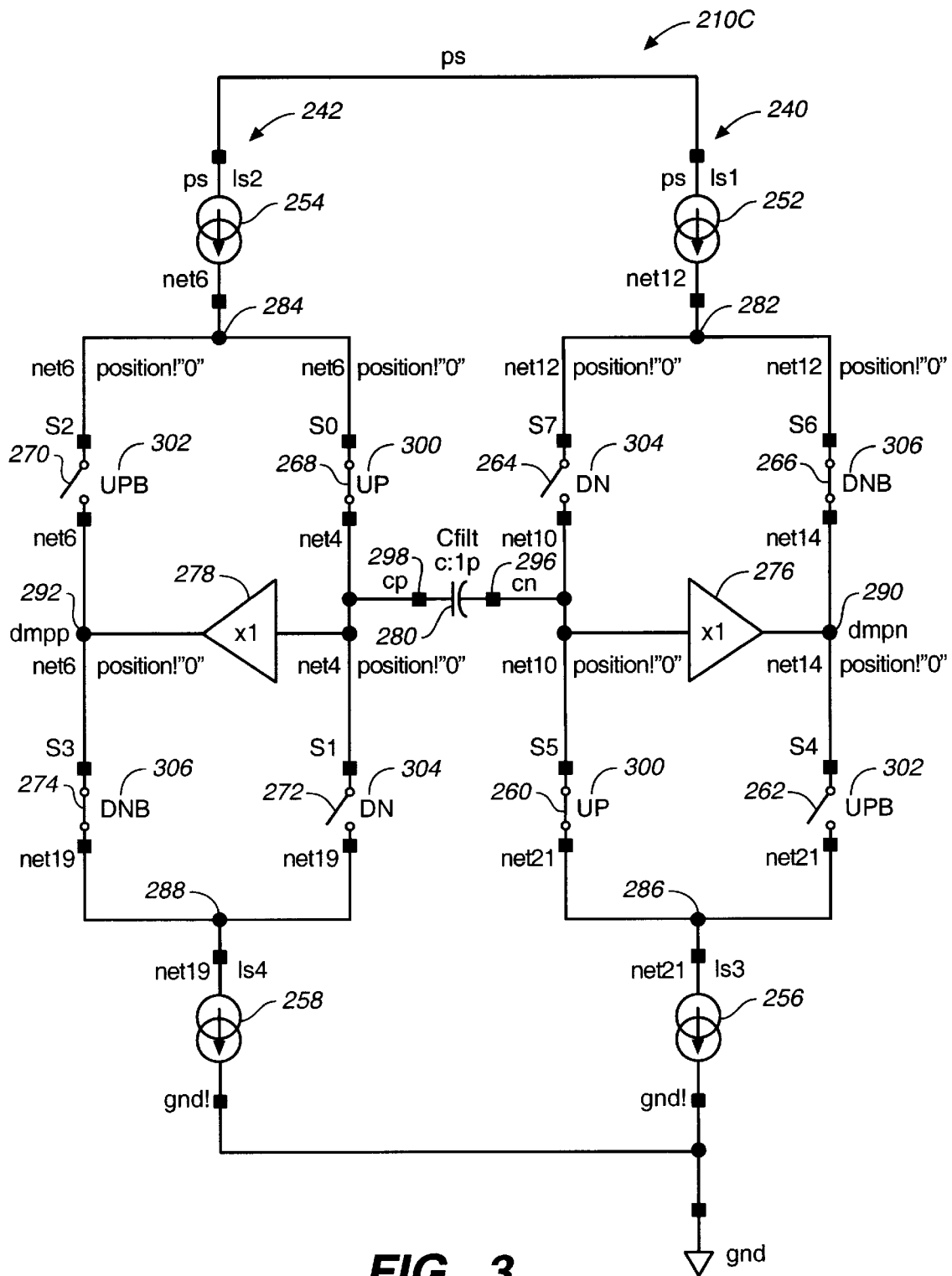
FIG._3

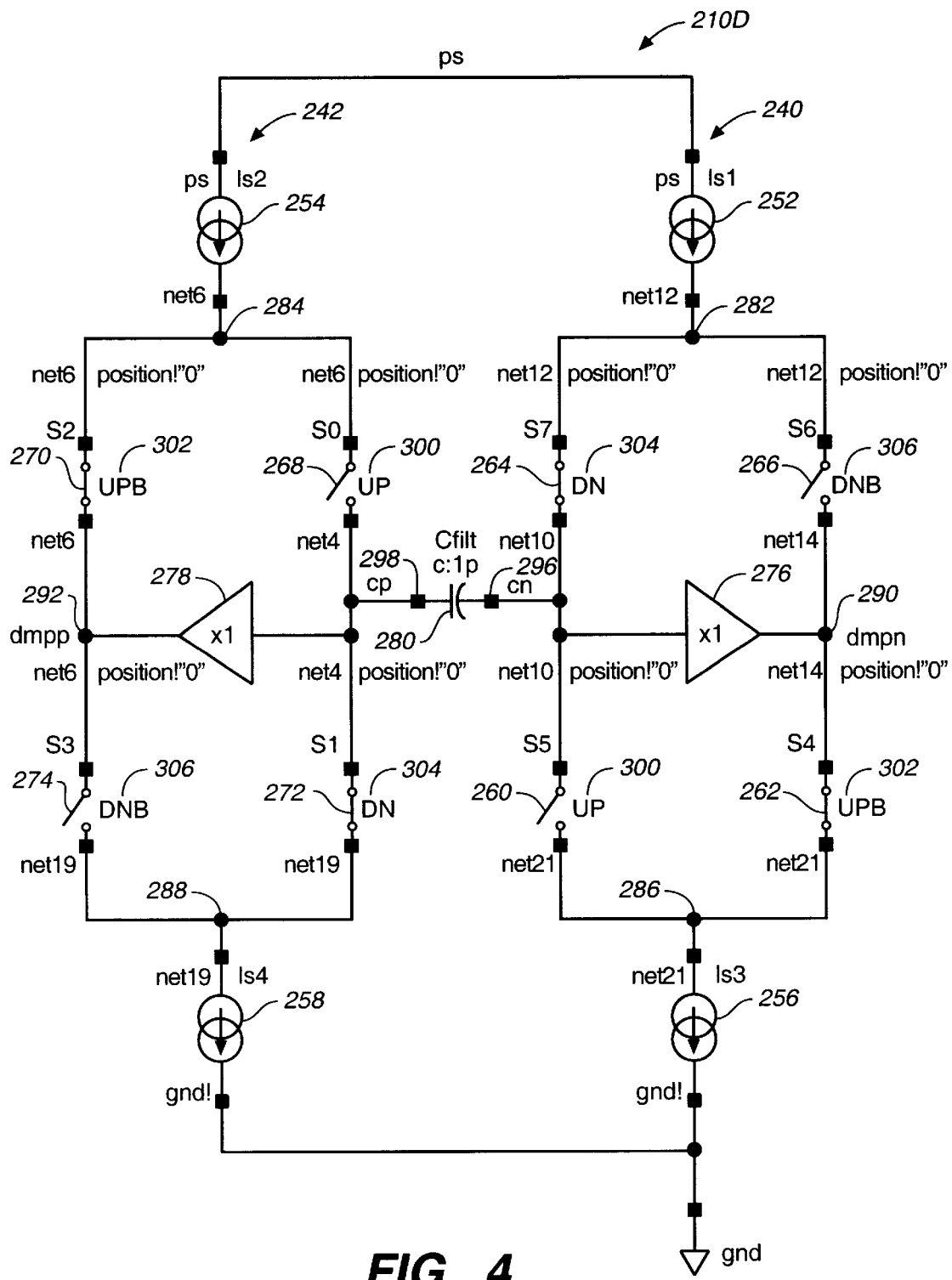
FIG._4

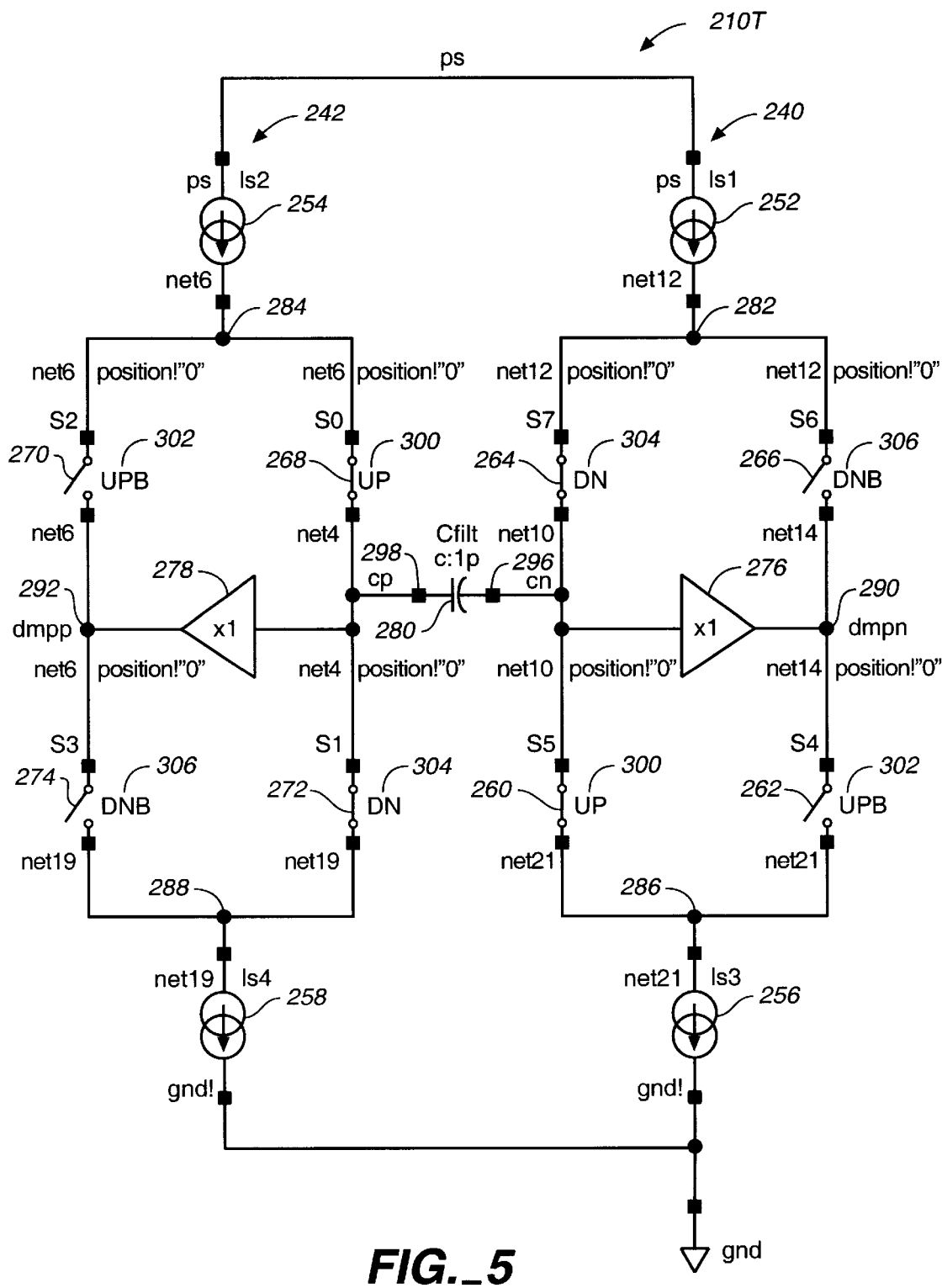
FIG._5

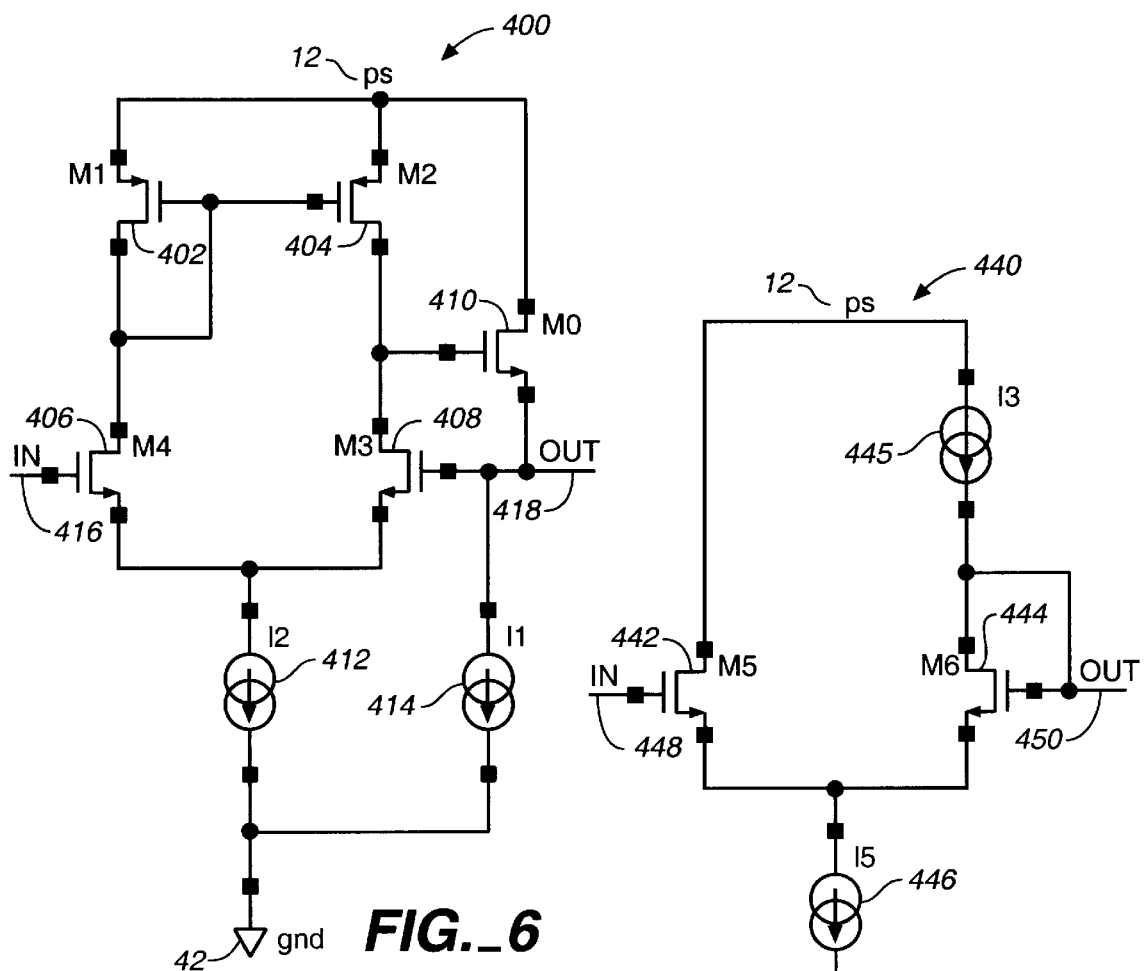
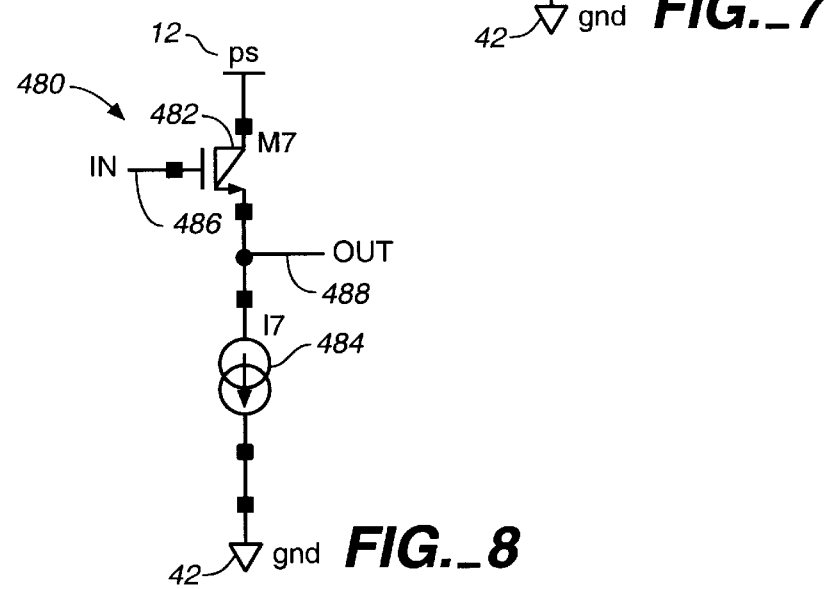
FIG._6
FIG._7
FIG._8

DIFFERENTIAL CHARGE PUMP WITH REDUCED CHARGE-COUPLING EFFECTS

BACKGROUND OF THE INVENTION

1. Field of the Invention

The present invention relates generally to a differential charge pump for use in integrated circuits. More specifically, a differential charge pump with reduced charge-coupling effects for use in integrated circuits such as a phase-lock loop is disclosed.

2. Description of Related Art

A phase-locked loop (PLL) generally comprises a phase detector, a low-pass loop filter, and a voltage-controlled oscillator (VCO). The VCO is an oscillator that produces a periodic wave form as an output signal, the frequency of which may be varied about some free-running frequency depending upon the value of the applied voltage. The free-running frequency is the frequency of the oscillator signal or the VCO output when the applied voltage is 0.

The phase detector receives an incoming signal and the output signal of the VCO and produces a phase detector output signal. The phase detector output signal represents the phase difference between the incoming and oscillator signals. The phase detector output signal is filtered through the low pass filter. The output of the low pass filter is the output of the PLL and the applied voltage to the VCO used to change the frequency of the VCO output. The closed-loop operation of the circuit maintains the VCO frequency locked to that of the incoming signal frequency.

If the applied signal of the VCO has the free-running frequency as an initial frequency, the PLL will acquire lock and the VCO will track the incoming signal frequency over some range, provided that the incoming signal frequency changes slowly. However, the loop will remain locked only over some finite range of frequency shift.

When the loop is operating in lock, the incoming signal and the VCO output signal fed to the phase comparator are of the same frequency. When the loop is trying to achieve lock, the output of the phase comparator contains frequency components at the sum and difference of the signals compared. The low-pass filter passes only the lower frequency component of the signals so that loop can obtain lock between incoming and VCO signals.

During lock, the output of the low-pass filter is the value needed to hold the VCO in lock with the incoming signal. The VCO then outputs a fixed amplitude wave signal at the frequency of the incoming signal. A fixed phase difference between the incoming and the VCO output signals to the phase comparator results in a fixed applied voltage to the VCO. Changes in the incoming signal frequency then results in change in the applied voltage to the VCO.

The limited operating range of the VCO and the feedback connection of the PLL circuit results in two frequency bands specified for a PLL: a capture range and a lock range. The capture range of the PLL is the frequency range centered about the VCO free-running frequency over which the loop can acquire lock with the input signal. The lock range of the PLL is generally wider than the capture range and is the range over which the PLL can maintain lock with the incoming signal once the PLL achieves capture. Within the capture-and-lock frequency ranges, the applied voltage drives the VCO frequency to match that of the incoming signal.

A PLL can be used in a wide variety of applications, including (1) modems, telemetry receivers and transmitters, tone decoders, AM detectors, and tracking filters; (2) demodulation of two data transmission or carrier frequencies in digital-data transmission used in frequency-shift keying (FSK) operation; (3) frequency synthesizers that provide multiples of a reference signal frequency (e.g. the carrier for the multiple channels of the citizen's band (CB) unit or marine-radio-band unit can be generated using a single-crystal-controlled frequency and its multiples generated using a PLL); and (4) FM demodulation networks for FM operation with excellent linearity between the input signal frequency and the PLL output voltage.

The PLL may also include a charge pump coupled between the phase detector and the low pass loop filter. The charge pump is a circuit block that serves as a source or sink of charge for the loop filter. In a typical implementation of the charge pump, two current sources, each in series with a switch are connected to the loop filter. The switches of the charge pump are typically controlled by the phase detector, which are updated to synchronize the output of the VCO to the incoming signal.

In a conventional charge pump, damp nodes of the charge pump are fixed to reference voltages and are independent of the voltages present on nodes on either side of a charge pump capacitor. As a result, during high speed operation of the charge pump, the voltages at the current source and sink nodes are alternately switched between a node on a corresponding side of the charge pump capacitor and a fixed reference voltage. This voltage switching characteristic modulates the magnitude of the currents through the charge pump and also leads to undesirable charge-coupling effect.

As the performance of the PLL is dependent in part upon the operating response time of the charge pump, it is desirable to provide a high speed charge pump with reduced charge-coupling effect.

SUMMARY OF THE INVENTION

A system and method for a differential charge pump with reduced charge-coupling effects for use in integrated circuits such as a phase-lock loop are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

In a preferred embodiment, the differential charge pump comprises a first branch, a second branch, and a charge device. The first branch includes a first current source and sink coupled to a power supply and ground, respectively, a first current steering device coupled between the first current source and sink, and a first buffer coupled to the first current steering device between a first charge node and a first damp node. The second branch includes a second current source and sink coupled to a power supply and ground, respectively, a second current steering device coupled between the second current source and sink, and a second buffer coupled to the second current steering device between a second charge node and a second damp node, each of the current steering devices being adapted to selectively steer current from at least one of the current sources to at least one of the current sinks. The charge device is coupled between the first buffer and the second buffer at the first and second charge nodes, the first and second buffers being adapted to vary voltages at the first and second damp nodes relative to voltages at the first and second charge nodes, respectively.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a schematic of a timing recovery using a modified second order PLL;

FIG. 2 is a circuit diagram of a differential charge pump with reduced charge-coupling effects;

FIG. 3 is a circuit diagram of the differential charge pump of FIG. 2 charging a charge pump capacitor;

FIG. 4 is a circuit diagram of the differential charge pump of FIG. 2 discharging the charge pump capacitor;

FIG. 5 is a circuit diagram of the differential charge pump of FIG. 2 providing a high-impedance to the charge pump capacitor;

FIG. 6 is a circuit diagram of an example of a unity gain amplifier which may be utilized in the differential charge pump of FIG. 2;

FIG. 7 is a circuit diagram of another example of a unity gain amplifier which may be utilized in the differential charge pump of FIG. 2; and FIG. 8 is a circuit diagram of a preferred a unity gain amplifier which may be utilized in the differential charge pump of FIG. 2.

DESCRIPTION OF SPECIFIC EMBODIMENTS

A system and method for a differential charge pump with reduced charge-coupling effects for use in integrated circuits such as a phase-lock loop are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

FIG. 1 is a schematic of a portion 200 of a timing recovery loop using a modified second order PLL. Incoming signal 202 is quantized by an analog-to-digital converter ("ADC") 204 into one of, for example, forty-two (42) unique levels or outputs 206. Each of the outputs 206 of the ADC 204 controls a loop filter 214 through a corresponding phase detector 208 each followed by a charge pump 210. Each phase detector 208 detects the phase difference between the incoming signal 202 and output VCOOUT 226 of a VCO 224. The charge pump 210 is a circuit block that serves as a source or sink of charge for the loop filter 214. In a typical implementation of a charge pump 210, two current sources, each in series with a switch are connected to a loop filter node 212. The switches of the charge pump 210 are typically controlled by the corresponding phase detector 208, which are updated to synchronize the output VCOOUT 226 of the VCO 224 to the incoming signal 202.

The phase difference information detected by the phase detector 208 is stored on the loop filter 214. The loop filter 214 includes a resistor 216 and a capacitor 218. The loop filter 214 serves to integrate the phase difference information on the voltage node 212 which drives the VCO 224 to attain phase and frequency synchronization with the incoming signal 202. As the VCO 224 is an integrator, the loop filter 214 adds a zero in the transfer function such that the overall loop is stable 200. Synchronization of the VCO 224 is achieved by using the output VCOOUT 226 of the VCO 224 to clock the ADC 204.

Between the VCO 224 and the loop filter 214 are a transconductor Gm 220 and a VCO bias block 222. The transconductor 220 sets the control gain of the VCO 224 with respect to the voltage at the loop filter node 212, with units [Hz/Volt]. The VCO bias block 222 generates the appropriate bias voltages and currents for the VCO 224.

Preferably, the charge pump 210 is a differential charge pump with reduced charge-coupling effects as shown in the circuit diagram of FIG. 2. As shown, the charge pump 210 generally comprises first and second branches 240, 242 coupled between a power supply 12 and ground 42. In particular, the charge pump 210 comprises first and second current sources 252, 254, first and second current sinks 256, 258, first and second current steering devices comprising switches 260–266 and 268–274, respectively, first and second unity gain voltage amplifiers or buffers 276, 278, and a charge pump capacitor 280. Generally, currents through each of current sources 252, 254 and current sinks 256, 258 are designed to be of equal magnitude.

The first and second current sources 252, 254 are coupled between the power supply 12 and a first and a second current source nodes 282, 284, respectively. The first and second current sinks 256, 258 are coupled between first and second current sink nodes 286, 288, respectively, and ground 42. The charge pump capacitor 280 is coupled between the first and second branches 240, 242 via first and second capacitor nodes 296, 298. The first unity gain voltage amplifier 276 is coupled between a first capacitor node 296 and a first damp node 290. The second unity gain voltage amplifier 278 is coupled between a second capacitor node 298 and a second damp node 292.

The first branch 240 includes first charge, complementary charge, discharge, and complementary discharge switches 260, 262, 264, 266, respectively. The second branch 242 includes second charge, complementary charge, discharge, and complementary discharge switches 268, 270, 272, 274, respectively. Each of the first and second charge switches 260, 268 receives input signal UP 300 and each of the first and second complementary charge switches 262, 270 receives input signal UPB 302, where UPB 302 is opposite in phase to UP 300, e.g., with differential coupling. In addition, each of the first and second discharge switches 264, 272 receives input signal DN 304 and each of the first and second complementary discharge switches 266, 274 receives input signal DNB 306, where DNB 306 is opposite in phase to DN 304, e.g., with differential coupling. As is well known in the art, when an input signal to a switch is high or logic 1, the switch is closed while when an input signal to a switch is low or logic 0, the switch is open.

Input signals to switches 260–274 control the state of the charge pump 210. The possible states are charge, as shown in FIG. 3, discharge, as shown in FIG. 4, and tristate, as shown in FIG. 5. A charge state charges the charge pump capacitor 280 while a discharge state discharges the charge pump capacitor 280. In addition, tristate presents a high impedance to the charge pump capacitor 280. It is to be understood that the case where all the input signals 300–306 to switches 260–274 are low such that all switches are open does not occur and is only shown in FIG. 2 for illustrative purposes only.

FIG. 3 is a circuit diagram of the differential charge pump 210C in a charge state to charge the charge pump capacitor 280 or to maintain the charged state of the charge pump capacitor 280. In the charge state charge pump 210C, input signals UP 300 and DNB 306 are high while input signals UPB 302 and DN 304 are low. Consequently, the first and second charge switches 260, 268 and the first and second complementary discharge switches 266, 274 are closed. In addition, the first and second discharge switches 264, 272 and the first and second complementary charge switches 262, 270 are open.

Current from the second current source 254 flows through the first current sink 256 via the second current source node 284, the second charge switch 268, capacitor 280, and the first charge switch 260, thereby charging the charge pump capacitor 280. In other words, the voltage at the first capacitor node 296 becomes low while the voltage at the second capacitor node 298 becomes high. Current from the first current source 252 flows to the first unity gain buffer 276, which functions as a current sink, via the first discharge complement switch 266 and the first damp node 290. Current through the second current sink 258 is diverted to the second damp node 292 via the closed second complement discharge switch 274.

FIG. 4 is a circuit diagram of the differential charge pump 210D in a discharge state to the discharge the charge pump capacitor 280 or to maintain the discharged state of the charge pump capacitor 280. In the discharge state charge pump 210D, input signals DN 304 and UPB 302 are high while input signals UP 300 and DNB 306 are low. Consequently, the first and second discharge switches 264, 272 and the first and second complementary charge switches 262, 270 are closed. In addition, the first and second charge switches 260, 268 and the first and second complementary discharge switches 266, 274 are open.

Current from the first current source 252 flows through the second current sink 258 via the first current source node 282, the first discharge switch 264, capacitor 280, and the second discharge switch 272, thereby discharging the charge pump capacitor 280. In other words, the voltage at the first capacitor node 296 becomes high while the voltage at the second capacitor node 298 becomes low. Current from the second current source 254 flows to the second unity gain buffer 278, which functions as a current sink, via the second charge complement switch 270 and the second damp node 292. Current through the first current sink 256 is diverted to the first damp node 290 via closed first charge complement switch 262.

In a conventional charge pump, unity gain buffers are not provided such that the first and second damp node 290, 292 are at fixed reference voltages and are independent of the voltages at first and second capacitor nodes 296, 298, respectively. Because the steering switches are designed to minimize the voltage drop across each switch, this conventional configuration implies that at high speed operation of the charge pump, the voltages at the first current source and sink nodes 282, 286 would be alternately switched between the voltage at the first capacitor node 296 and the fixed reference voltage at the first damp node 290. Similarly, the voltages at the second current source and sink nodes 284, 288 would be alternately switched between the voltage at the second capacitor node 298 and the fixed reference voltage at the second damp node 292.

For example, with a conventional charge pump in the charging state, the first current source node 282 would be at the fixed reference voltage of the first damp node 290 while the first current sink node 286 would be at the voltage of the first capacitor node 296. In addition, the second current source node 284 would be at the voltage of the second capacitor node 298 while the second current sink node 288 would be at the fixed reference voltage at the second damp node 292.

Further, with a conventional charge pump in the discharging state, the first current source node 282 would be at the voltage of the first capacitor node 296 while the first current sink node 286 would be at the fixed reference voltage of the first damp node 290. In addition, the second current source node 284 would be at the fixed reference voltage of the second damp node 292 while the second current sink node 288 would be at the voltage of the second capacitor node 298.

As is evident, at high speed operation of the charge pump, the conventional configuration would cause the voltages at the first current source and sink nodes 282, 286 to alternately switch between the voltage at the first capacitor node 296 and the fixed reference voltage at the first damp node 290. Similarly, the conventional configuration would also cause the voltages at the second current source and sink nodes 284, 288 to alternately switch between the voltage at the second capacitor node 298 and the fixed reference voltage at the second damp node 292. This situation modulates the magnitude of the currents of current sources and sinks 252–258 and also leads to an undesirable charge-coupling effect. Further, under such circumstances, the voltages at the first and second current source and sink nodes 282–288 would need to switch quickly in order to achieve the desired speed in the charge pump. However, it may be difficult to achieve such voltage switching speeds.

In contrast, employing the unit gain buffers 276, 278 can facilitate in reducing the charge coupling effect. In particular, with the first unit gain buffer 276, the voltage at the first damp node 290 tracks the voltage at the first capacitor node 296. Similarly, with the second unit gain buffer 278, the voltage at the second damp node 292 tracks the voltage at the second capacitor node 298. Such voltage tracking at the first and second damp nodes 290, 292 is regardless of the charge, discharge or other state of the charge pump 210. Thus, as the voltages at the first and second capacitor nodes 296, 298 vary, the voltages at the first and second damp nodes 290, 292 vary accordingly.

FIG. 5 is a circuit diagram of the differential charge pump 210T in a tristate to present a high-impedance to the charge pump capacitor 280. In the tristate charge pump 210T, input signals UP 300 and DN 304 are high while input signals UPB 302 and DNB 306 are low. Consequently, the first and second charge and discharge switches 260, 264, 268, 272 are closed while the first and second complementary charge and discharge switches 262, 266, 270, 274 are open.

Current from the first current source 252 flows through the first current sink 256 via the first current source node 282, the first discharge switch 264, the first charge switch 260, and the first current sink node 286. In addition, current from the second current source 254 flows to the second current sink 258 via the second current source node 284, the second charge switch 268, the second discharge switch 272, and the second current sink node 288. As noted above, the currents through each of the current sources and sinks 252–258 are equal such that the currents flowing through the first and second branches 240, 242, e.g., the currents flowing through the first and second capacitor nodes 296, 298, are equal. As no current flows through the capacitor 280, the capacitor 280 is neither charged nor discharged and remains stable, whether the capacitor 280 is in a charged, discharged, or an intermediate state. Meanwhile, the first and second unity buffers 276, 278 continue to facilitate the first and second damp nodes 290, 292 to remain tracked to voltages at the first and second capacitor nodes 296, 298, respectively.

In the differential charge pump 210, each unit gain voltage amplifier 276, 278 is preferably implemented in a manner to minimize additional circuitry as compared to conventional charge pumps. FIGS. 6–8 illustrate a conventional, an improved, and a preferred unity gain amplifier, respectively. In each of these unity gain amplifiers, the circuit is designed such that the voltage at an input is the same as the voltage at the output.

FIG. 6 is a circuit diagram of an example of a unity gain amplifier 400 which may be utilized in the differential charge pump of FIG. 2. As shown, the unity gain amplifier 400 generally comprises first and second PMOS transistors 402, 404 having source nodes coupled to the power supply 12, first, second, and third NMOS transistors 406, 408, 410, and first and second current sinks 412, 414 coupled to ground 42.

Specifically, the gates of PMOS transistors 402, 404 as well as the drain of the first NMOS transistor 406 are coupled to each other. An input 416 of the unity gain amplifier 400 drives the gate of the first NMOS transistor 406. The source of the first NMOS transistor is coupled to the source of the second NMOS transistor 408 and to the first current sink 412. The drain of the second PMOS transistor 404 is coupled to the drain of the second transistor 408 and drives the gate of the third NMOS transistor 410. The drain of the third NMOS transistor 410 is coupled to the power supply while the source of the third NMOS transistor 410, from which output 418 of the unity gain amplifier 400 is taken, is coupled to the second current sink 414 and to the gate of the second NMOS transistor 408. The unity gain amplifier 400 is a closed loop configuration and utilizes several devices to achieve a unity gain of the input voltage as the output.

FIG. 7 is a circuit diagram of another example of a unity gain amplifier 440 which may be utilized in the differential charge pump of FIG. 2. As shown, the unity gain amplifier 440 generally comprises first and second NMOS transistors 442, 444, a current source 445 coupled to the power supply 12, and a current sink 446 coupled to ground 42. An input 448 of the unity gain amplifier 440 drives the gate of the first NMOS transistor 442. The drain of the first NMOS transistor 442 is coupled to the power supply 12. The source of the first NMOS transistor 442 is coupled to the current sink 446 and to the source of the second NMOS transistor 408. The drain and gate of the second NMOS transistor 444, from which an output 450 of the unity gain amplifier 440 is taken, are coupled to each other and to the current source 445. The configuration of the unity gain amplifier 440 is relatively open loop and utilizes fewer devices to achieve the unity gain result as compared to the unity gain amplifier 400 of FIG. 6.

FIG. 8 is a circuit diagram of a preferred unity gain amplifier 480 which may be utilized in the differential charge pump of FIG. 2. The unity gain amplifier 480 generally comprises a 0-$V_T$ NMOS device 482, i.e. an NMOS device with a zero or near 0 threshold voltage $V_T$, and a current sink 484. The drain, gate, source of the 0-$V_T$ NMOS device 482 are coupled to the power supply 12, an input 486 of the unity gain amplifier 480, and the current sink 484, respectively. Output 488 of the unity gain amplifier 480 is taken at the source of the 0-$V_T$ NMOS device 482. Utilizing a 0-$V_T$ NMOS device rather than a typical NMOS device allows even fewer devices to achieve the desired unity gain result.

As is evident, the unity gain amplifier 480 adds very few additional circuitry to the charge pump.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A charge pump, comprising:
   a first branch having a first current source coupled to a power supply, a first current sink coupled to ground, a first current steering device coupled between said first current source and sink, and a first buffer coupled to said first current steering device between a first charge node and a first damp node;
   a second branch having a second current source coupled to a power supply, a second current sink coupled to ground, a second current steering device coupled between said second current source and sink, and a second buffer coupled to said second current steering device between a second charge node and a second damp node; and
   a charge device coupled between said first buffer and said second buffer at said first and second charge nodes, said first and second buffers are adapted to vary voltages at said first and second damp nodes relative to voltages at said first and second charge nodes, respectively, and each of said first and second current steering devices is adapted to selectively steer current from one of said first and second current sources through said charge device to one of said first and second current sinks.

2. The charge pump of claim 1, wherein said first buffer and said second buffers are unity gain voltage amplifiers.

3. The charge pump of claim 1, wherein each of said unity gain voltage amplifiers comprises a 0-$V_T$ NMOS transistor a current sink.

4. The charge pump of claim 3, wherein a drain and a source of said 0-$V_T$ NMOS transistor of each unity gain amplifier are coupled to the power supply and said current sink, respectively.

5. The charge pump of claim 3, wherein an output of each of said unity gain amplifier is taken at a source of said 0-$V_T$ NMOS transistor.

6. The charge pump of claim 3, wherein an input of each of said unity gain amplifier drives a gate of said 0-$V_T$ NMOS transistor.

7. The charge pump of claim 1, wherein said first and second current sources and said first and second current sinks have currents of equal value.

8. The charge pump of claim 1, wherein said charge device is a capacitor.

9. The charge pump of claim 1, wherein each of said first and second current steering devices comprises a pair of differentially coupled charge switches and a pair of differentially coupled discharge switches.

10. The charge pump of claim 9, wherein said pair of differentially coupled charge and discharge switches of said first current steering device are coupled to said first current sink and said first current source, respectively, and wherein said pair of differentially coupled discharge and charge switches of said second current steering device are coupled to said second current sink and said second current source, respectively.

11. A phase-locked loop system, comprising:

a phase detector adapted to receive an input signal;

a charge pump coupled to said phase detector;

a loop filter coupled to said charge pump;

a transconductor coupled to said loop filter; and an oscillator coupled to the transconductor, said phase detector further adapted to receive an output of said oscillator, wherein said charge pump comprises:

a first branch having a first current source coupled to a power supply, a first current sink coupled to ground, a first current steering device coupled between said first current source and sink, and a first buffer coupled to said first current steering device between a first charge node and a first damp node;

a second branch having a second current source coupled to a power supply, a second current sink coupled to ground, a second current steering device coupled between said second current source and sink, and a second buffer coupled to said second current steering device between a second charge node and a second damp node; and a charge device coupled between said first buffer and said second buffer at said first and second charge nodes, said first and second buffers are adapted to vary voltages at said first and second damp nodes relative to voltages at said first and second charge nodes, respectively, and each of said first and second current steering devices is adapted to selectively steer current from one of said first and second current sources through said charge device to one of said first and second current sinks.

12. The phase-locked loop system of claim 11, wherein said first buffer and said second buffers are unity gain voltage amplifiers.

13. The phase-locked loop system of claim 11, wherein each of said unity gain voltage amplifiers comprises a 0-$V_T$ NMOS transistor and a current sink.

14. The phase-locked loop system of claim 13, wherein a drain and a source of said 0-$V_T$ NMOS transistor of each unity gain amplifier are coupled to the power supply and said current sink, respectively.

15. The phase-locked loop system of claim 13, wherein an output of each of said unity gain amplifier is taken at a source of said 0-$V_T$ NMOS transistor.

16. The phase-locked loop system of claim 13, wherein an input of each of said unity gain amplifier drives a gate of said 0-$V_T$ NMOS transistor.

17. The phase-locked loop system of claim 11, wherein said first and second current sources and said first and second current sinks have currents of equal value.

18. The phase-locked loop system of claim 11, wherein said charge device is a capacitor.

19. The phase-locked loop system of claim 11, wherein each of said first and second current steering devices comprises a pair of differentially coupled charge switches and a pair of differentially coupled discharge switches.

20. The phase-locked loop system of claim 19, wherein said pair of differentially coupled charge and discharge switches of said first current steering device are coupled to said first current sink and said first current source, respectively, and wherein said pair of differentially coupled discharge and charge switches of said second current steering device are coupled to said second current sink and said second current source, respectively.

* * * * *